(12) United States Patent
Nakamura

(10) Patent No.: US 11,230,762 B2
(45) Date of Patent: Jan. 25, 2022

(54) FILM STRUCTURE REPRODUCTION METHOD AND REPRODUCTION FILM STRUCTURE

(71) Applicant: ADMAP INC., Tamano (JP)

(72) Inventor: Masaki Nakamura, Tamano (JP)

(73) Assignee: ADMAP INC., Tamano (JP)

( * ) Notice: Subject to any disclaimer, the term of this patent is extended or adjusted under 35 U.S.C. 154(b) by 0 days.

(21) Appl. No.: 16/615,703

(22) PCT Filed: Sep. 27, 2019

(86) PCT No.: PCT/JP2019/038355
§ 371 (c)(1),
(2) Date: Nov. 21, 2019

(87) PCT Pub. No.: WO2020/250454
PCT Pub. Date: Dec. 17, 2020

(65) Prior Publication Data
US 2021/0025054 A1  Jan. 28, 2021

(30) Foreign Application Priority Data

Jun. 13, 2019  (JP) .............................. JP2019-110254

(51) Int. Cl.
*C23C 16/32* (2006.01)
*C23C 16/44* (2006.01)
*H01J 37/32* (2006.01)

(52) U.S. Cl.
CPC ........ *C23C 16/4404* (2013.01); *C23C 16/325* (2013.01); *H01J 37/32495* (2013.01); *H01J 37/32642* (2013.01)

(58) Field of Classification Search
None
See application file for complete search history.

(56) References Cited

U.S. PATENT DOCUMENTS

| 5,254,370 A * | 10/1993 | Nagasawa | C23C 16/48 427/249.15 |
| 2004/0126486 A1* | 7/2004 | Torigoe | C23C 4/02 427/142 |
| 2010/0314356 A1 | 12/2010 | Nagayama et al. | |
| 2012/0258258 A1* | 10/2012 | Nagayama | C23C 16/325 427/535 |
| 2013/0157067 A1 | 6/2013 | Kawamoto et al. | |

(Continued)

FOREIGN PATENT DOCUMENTS

| JP | 2004-079983 A | 3/2004 |
| JP | 2011-018894 A | 1/2011 |

(Continued)

OTHER PUBLICATIONS

Mar. 30, 2020 Office Action issued in Taiwanese Patent Application No. 108140805.

*Primary Examiner* — David P Turocy
(74) *Attorney, Agent, or Firm* — Oliff PLC

(57) ABSTRACT

A method of easily reproducing a film structure with low cost and a reproduction film structure manufactured using the same, the film structure reproduction method includes: a new film layer deposition step of depositing a new SiC layer on a non-active surface opposite to a damaged active surface; and an active surface fabrication step of fabricating the active surface to obtain a focus ring.

2 Claims, 10 Drawing Sheets

(56) References Cited

U.S. PATENT DOCUMENTS

2013/0284375 A1 10/2013 Nagayama et al.
2017/0345624 A1 11/2017 Kim et al.

FOREIGN PATENT DOCUMENTS

| JP | 2012-049220 A | 3/2012 |
| JP | 2017-212427 A | 11/2017 |
| TW | 201546946 A | 12/2015 |

* cited by examiner

FILM STRUCTURE REPRODUCTION METHOD AND REPRODUCTION FILM STRUCTURE

FIELD OF THE INVENTION

The present invention relates to reproduction of a structure configured by forming a film containing SiC, and more particularly, to a reproduction method and a reproduction structure suitable for reducing a reproduction cost of the film structure.

BACKGROUND OF THE INVENTION

When semiconductor manufacturing is performed through plasma etching treatment or the like, a surface of a SiC member (such as a jig) provided in a manufacturing chamber is partially corroded (damaged) due to influence of the plasma etching treatment. The SiC member is more resistant to particles and has higher durability, but is expensive, compared to an inexpensive Si member. For this reason, a technique of reducing a running cost for using the SiC member by reproducing the damaged SiC member has been discussed as disclosed in Patent Document 1 and Patent Document 2.

In both the techniques disclosed in Patent Documents 1 and 2, a new SiC layer is deposited through chemical vapor deposition (CVD) on a damaged surface of the SiC member damaged by use, and a shape of an original member is obtained by mechanically machining this new SiC layer.

CITATION LIST

Patent Documents

Patent Document 1: Japanese Unexamined Patent Application Publication No. 2012-49220
Patent Document 2: Japanese Unexamined Patent Application Publication No. 2017-212427

SUMMARY OF THE INVENTION

In the techniques disclosed in Patent Documents 1 and 2, it is possible to reliably obtain a reproduction member having the same quality as that of a SiC member before use. However, in the techniques disclosed in Patent Documents 1 and 2, the new SiC layer is deposited and fabricated after various pretreatment steps such as preprocessing or cleaning for the damaged portion, and masking for a portion where the new SiC layer is not deposited. For this reason, the reproduction cost increases, so that it is difficult to find out a merit, compared to a manufacturing cost of a new product.

In this regard, it is therefore an object of the present invention to provide a method of easily reproducing a film structure with low cost and a reproduction film structure manufactured using the same.

In order to achieve the aforementioned object, according to an aspect of the invention, there is provided a film structure reproduction method, including: a new film layer deposition step of depositing a new film layer having a thickness equal to or larger than a depth of a damage by setting a surface opposite to a damaged surface as a main body formation surface; and an active surface fabrication step of fabricating the damaged surface to have a desired shape, wherein, in the active surface fabrication step, fabrication is performed until a depth at which the damaged portion is completely removed.

In the film structure reproduction method having the aforementioned characteristics, the new film layer deposition step may be performed while active surfaces of two film structures come into contact or are adjacent to each other. In this characteristic, it is possible to deposit a new film layer on the non-active surface sides of the two film structures at one time.

In the film structure reproduction method having the aforementioned characteristics, the film structure may be a SiC member. By applying the method to a SiC member whose manufacturing cost is expensive, it is possible to obtain a high effect in terms of reduction of the manufacturing cost.

In order to achieve the aforementioned object, there is provided a reproduction film structure including: an active surface obtained by performing fabrication to completely remove a damaged portion on an old film layer having a damage; and a non-active surface obtained by forming a new film layer having a thickness equal to or larger than a depth of the damage on the old film layer as integrated two sides.

Using the film structure reproduction method having the aforementioned characteristics, it is possible to easily reproduce the film structure with low cost.

DESCRIPTION OF EMBODIMENTS

A film structure reproduction method and a reproduction film structure according to an embodiment of the present invention will now be described in details with reference to the accompanying drawings. The film structure reproduction method according to this embodiment is effectively applied by using a SiC member such as a jig provided in a semiconductor manufacturing chamber for plasma etching treatment or the like as a main body.

First Embodiment

Hereinafter, a focus ring 10 as a SiC member used to support a wafer (not shown) for plasma etching treatment will be described as an example of the film structure according to an embodiment of the invention. The focus ring 10 is a support member interposed between a lower electrode and a wafer in a chamber when plasma etching is performed. For this reason, the focus ring 10 at least has a spot face (step) 12 for placing a wafer and a through-hole 14 for inserting an electrostatic chuck. Note that the shape of the focus ring 10 is not limitative, but has a so-called doughnut shape in the examples of FIGS. 1 to 4.

Figure 1:
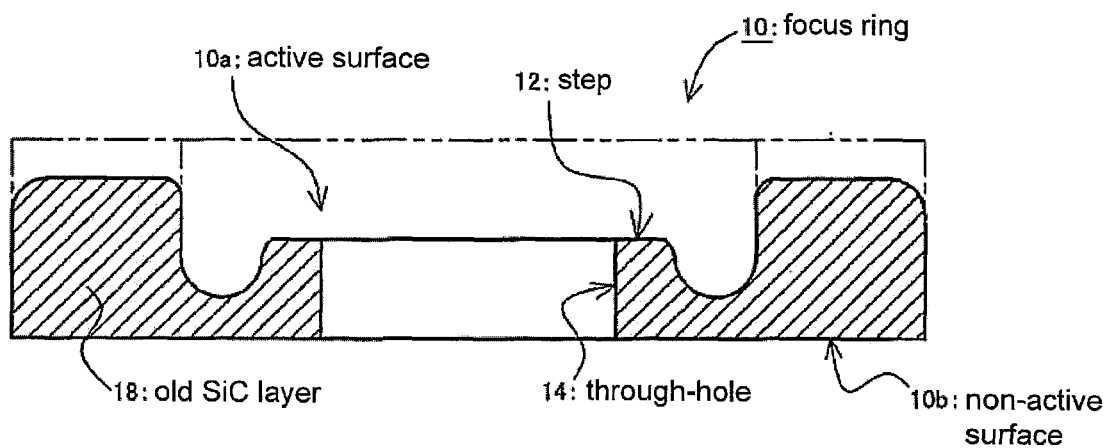
FIG. 1 is a cross-sectional view illustrating a shape of a focus ring damaged by use.
Figure 2:
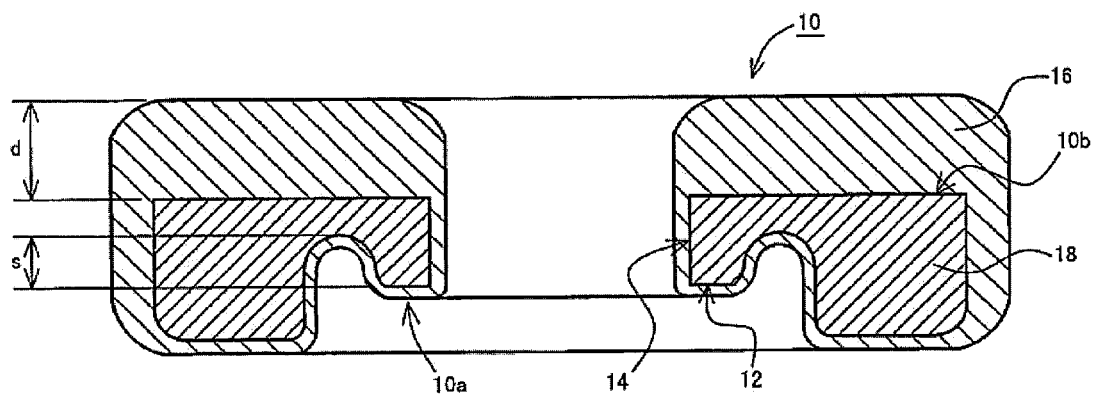
FIG. 2 is a cross-sectional view illustrating a state in which a new SiC layer is formed in an outer circumference of the focus ring.

In the focus ring 10 having such a configuration, a surface where the wafer is placed (active surface 10a) is eroded and damaged (corroded) by plasma due to influence of the plasma etching treatment. Although the damage state of the active surface 10a is not uniform, the damage tends to increase in the outer edge portion of the step 12 adjacent to the vicinity of the outer circumference of the wafer as illustrated in FIG. 1 which shows a cross-sectional shape of the damaged focus ring. Note that the contour line indicated by the two-dotted chain line in FIG. 1 shows an external shape of the focus ring 10 before damage.

In this embodiment, a method of reproducing a film structure (focus ring 10) damaged on the active surface 10a in this manner will be described with reference to FIGS. 1 to 4 and 5. According to this embodiment, a SiC layer as a new film layer (hereinafter, referred to as a new SiC layer 16) is formed on a surface of the film structure having a damage on the active surface 10a using a CVD method, particularly, a plasma CVD method in order to achieve reproduction. Note that, while the film formation method may include other CVD methods such as a thermal CVD method or an optical CVD method, the plasma CVD method is preferably employed because it facilitates high speed deposition.

Figure 5:
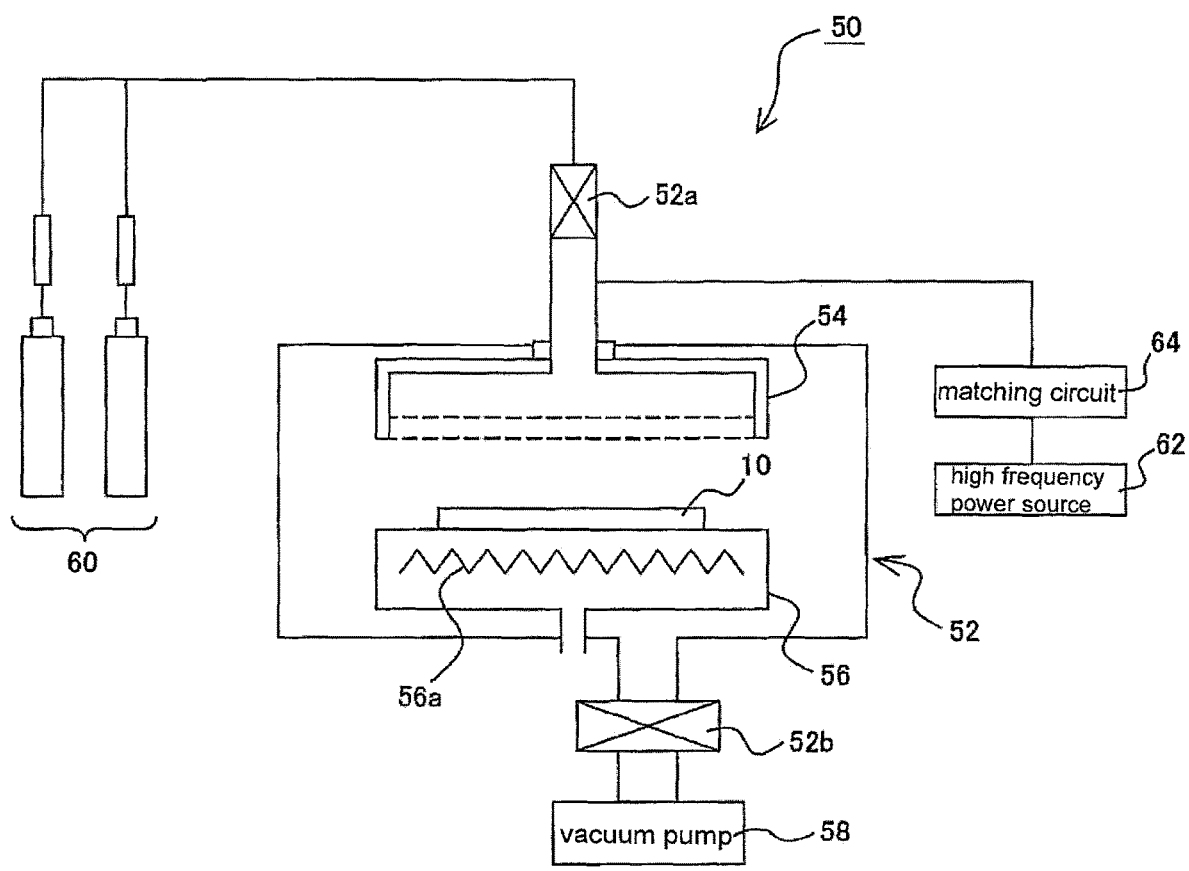
FIG. 5 is a diagram illustrating a schematic configuration of a CVD film formation apparatus used in film formation of the new SiC layer.

Here, a schematic configuration of the CVD film formation apparatus for performing a film structure reproduction method according to this embodiment is illustrated in FIG. 5. The CVD film formation apparatus 50 of FIG. 5 basically includes a chamber 52, a source gas container 60, and a high-frequency power source 62. The chamber 52 has a shower head 54 that blasts a source gas in a plasma state and a mounting table 56 on which a film formation target (in this embodiment, the focus ring 10) is placed, and is installed with a vacuum pump 58. In addition, valves 52a and 52b are provided in an inlet side (source gas supply side) and an outlet side (vacuum pump arrangement side), respectively, so that the chamber can be evacuated. Note that the mounting table 56 has a heater 56a for heating the film formation target.

The high frequency power source 62 is an element that applies a voltage for converting the source gas supplied from the source gas container 60 into a plasma state, and a matching circuit 64 is inserted.

<New Film Layer Deposition Step>

In the film structure reproduction method according to an embodiment of the invention, first, the focus ring 10 as a film structure is placed on the mounting table 56 inside the chamber 52 of the CVD film formation apparatus 50. In this case, the non-active surface 10b of the focus ring 10 is set as a main body formation surface of the new SiC layer 16. For example, in a case where the focus ring 10 is placed on the mounting table 56 of the CVD film formation apparatus 50 of FIG. 5, the active surface 10a is arranged to face the mounting table 56. As a result, it is difficult to perform deposition on the new SiC layer 16 in the active surface 10a side adjacent to the mounting table 56.

Figure 6:
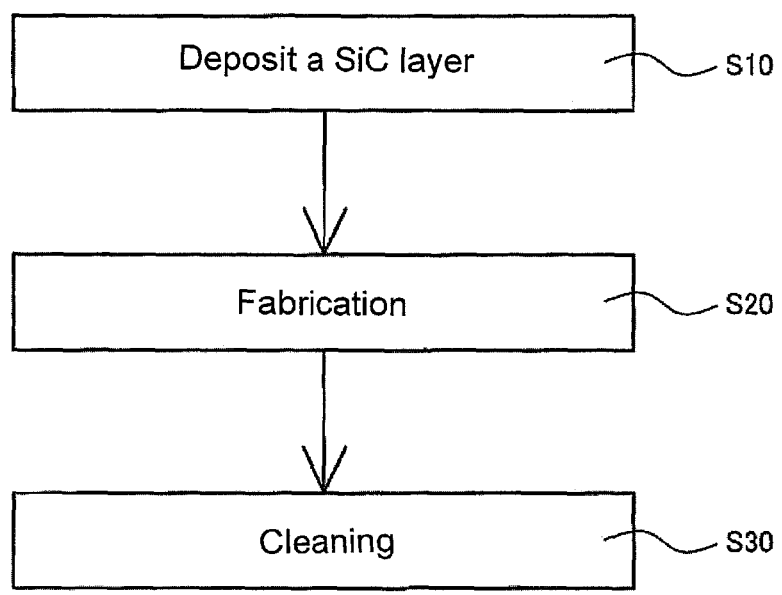
FIG. 6 is flowchart illustrating a configuration for performing a film structure reproduction method according to a first embodiment.

Next, a new SiC layer 16 is formed on the upper surface of the SiC layer included in the damaged focus ring 10 (hereinafter, referred to as an old SiC layer 18). The deposition thickness "d" of the new SiC layer 16 is not limited, but is set to at least a thickness equal to or larger than a damage depth "s" of the focus ring 10 (see FIG. 2). Here, the new SiC layer 16 is formed to be thickest in the upper surface side of the apparatus, that is, the non-active surface 10b side (S10: see FIG. 6).

<Active Surface Fabrication Step>

After the new SiC layer 16 is formed on the outer circumference of the old SiC layer 18, the focus ring 10 is extracted from the CVD film formation apparatus 50. The outer circumference of the extracted focus ring 10 is cut or ground to trim the shape. The cutting or grinding method is not limited. However, in the case of mechanical machining, basically, a reference surface is formed, and a dimension is then set with respect to this reference surface. Then, a machining allowance is determined, and cutting or grinding for other surfaces is performed.

Figure 3:
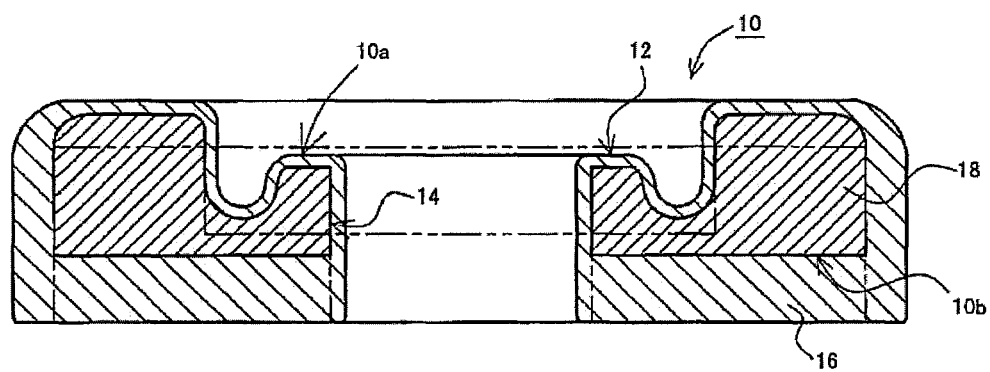
FIG. 3 is a cross-sectional view illustrating a state in which a reference surface is formed by cutting a new SiC layer formed on a non-active surface.

In the case of this embodiment, as illustrated in FIG. 3, the reference surface is formed by cutting or grinding the new SiC layer 16 deposited on the non-active surface 10b side within a minimum range. Note that the contour line indicated by the two-dotted chain line in FIG. 3 represents a desired outer shape of the focus ring 10.

Figure 4:
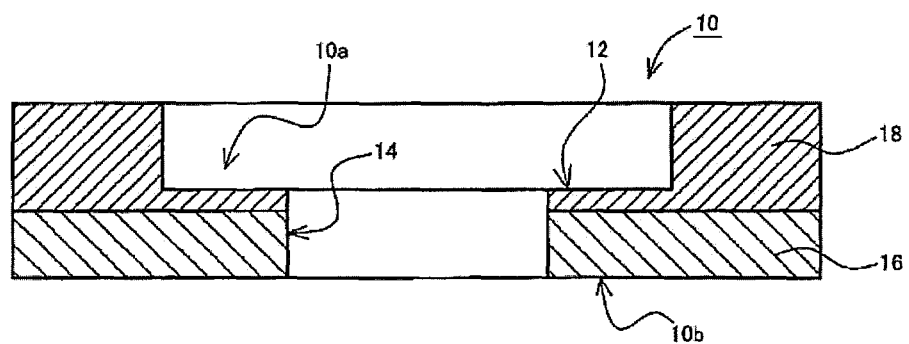
FIG. 4 is a cross-sectional view illustrating a state in which the focus ring is reproduced using a shaping frame.

After forming the reference surface, the outer surface, the active surface 10a, and the inner surface (through-hole 14) are fabricated to form the new focus ring 10 (reproduction film structure) of FIG. 4. Here, regarding the fabrication of the active surface 10a, it is desirable to perform the fabrication to a depth (thickness) by which the damaged portion (corroded portion) can be completely removed. This is to prevent generation of particles caused by the brittle corroded portion when the reproduced focus ring 10 is used (S20: see FIG. 6).

<Cleaning Step>

After completing the fabrication, cleaning is performed to remove impurities or the like adhering on the surface of the focus ring 10 through the fabrication. In the reproduced focus ring 10, the old SiC layer 18 and the new SiC layer 16 mixedly exist, but only the old SiC layer 18 remains on the active surface (S30: see FIG. 6).

<Effects>

According to the film structure reproduction method having such characteristics, it is not necessary to fabricate or clean the damaged portion in the old film layer (the old SiC layer 18 of the embodiment) before the new film layer (the new SiC layer 16 of the embodiment) is formed. For this reason, the fabrication can be performed merely by shaping after forming the new film layer. Therefore, it is possible to easily obtain a reproduced film structure at low cost.

By performing the fabrication after forming the new SiC layer 16 as a new film layer on the non-active surface 10b side, it is possible to reproduce the film structure (the focus ring 10 of the embodiment) even when the damage is deep, and it is difficult to perform preliminary fabrication. In the prior art, cutting or grinding of the preliminary fabrication is performed until the damaged portion is planarized. However, in a case where the thickness of the fabricated member becomes excessively thin, the member may be damaged or bent, so that it is difficult to perform the preliminary fabrication. However, according to this embodiment, since the step of forming the new film layer (new SiC layer 16) is performed before fabrication, it is possible to secure the thickness of the member even when the damage of the old film layer (old SiC layer 18) is deep. Therefore, it is possible to form the reproduction film structure (focus ring 10).

It is possible to obtain the reproduction film structure (focus ring 10) formed as described above with lower cost, compared to manufacturing of a new product, while securing quality as a single film structure (the member formed of SiC in this embodiment).

Note that, according to this embodiment, a CVD method is employed as an example of the formation means of the new SiC layer 16. However, regarding formation of the new SiC layer 16, a physical vapor deposition (PVD) method such as vacuum deposition or sputtering may be employed. This is because the film structure reproduction method according to the present invention can be performed if the new SiC layer 16 can be formed on the non-active surface 10b side of the old SiC layer 18.

Second Embodiment

Figure 7:
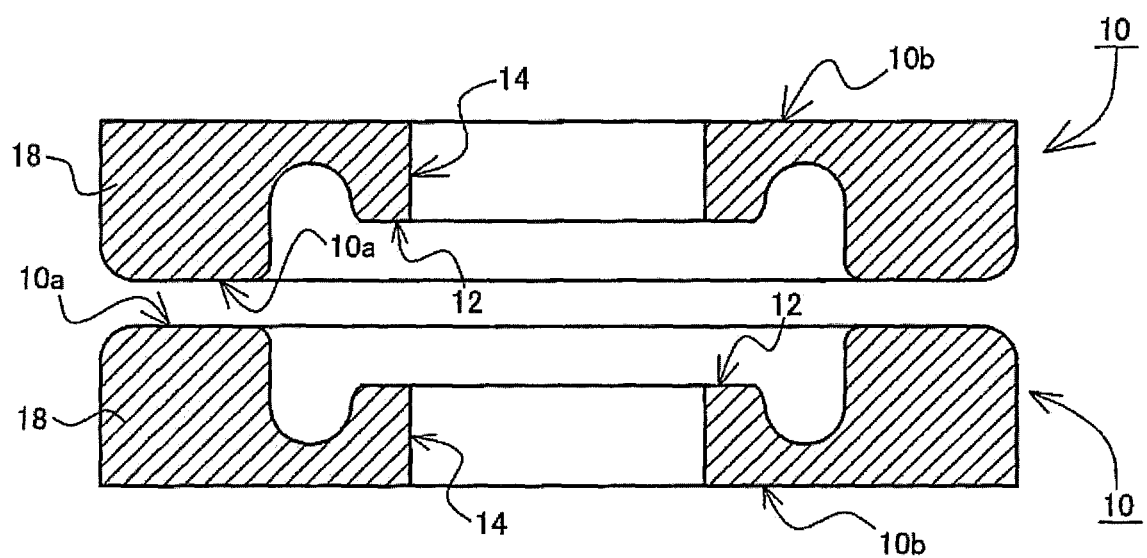
FIG. 7 is a cross-sectional view illustrating a focus ring arrangement form for performing a film structure reproduction method according to a second embodiment.
Figure 8:
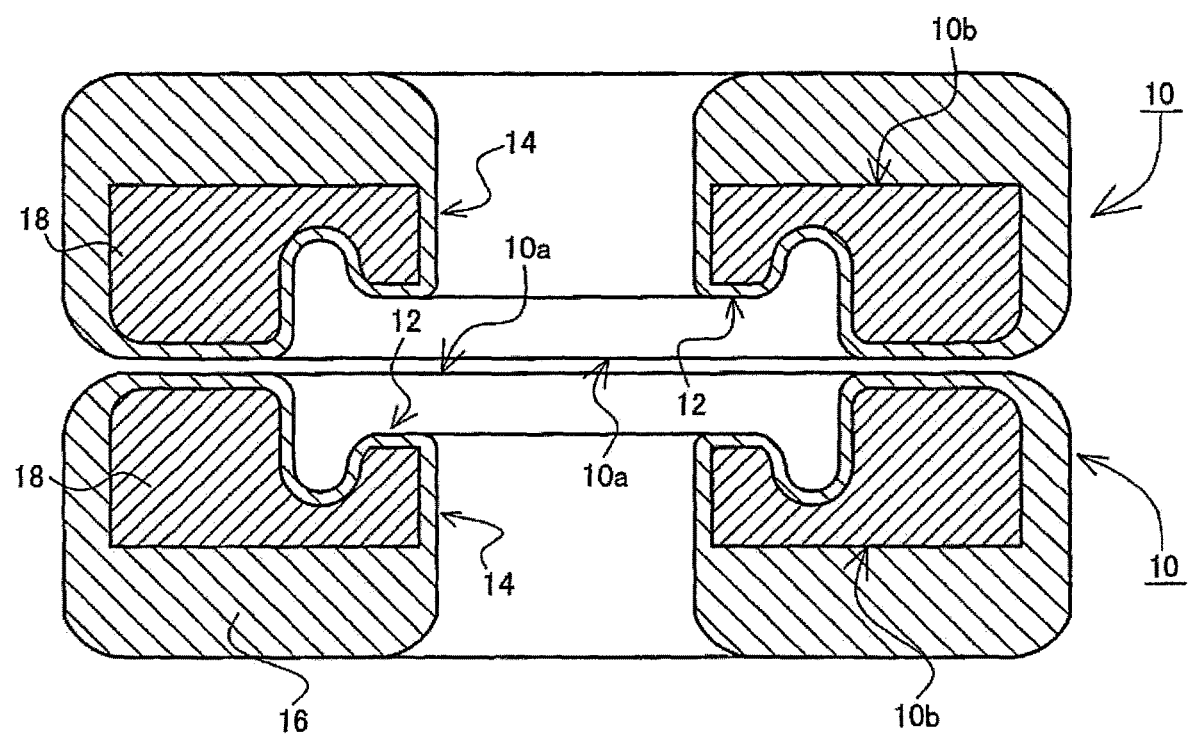
FIG. 8 is a cross-sectional view illustrating a new SiC layer formed on each non-active surface of a pair of focus rings as a main body.

Next, a film structure reproduction method according to a second embodiment of the present invention will be described with reference to FIGS. 7 and 8. Note that the film structure reproduction method according to this embodiment has a basic step similar to that of the film structure reproduction method of the first embodiment described above.

The film structure reproduction method according to the second embodiment is different from that of the first embodiment in that a step of forming two film structures as a pair of new film layers is performed.

Specifically, two focus rings 10 as film structures are arranged such that their active surfaces 10a face each other. In this case, the active surfaces 10a of the two focus rings 10 have a contact state or an adjacent state.

The new SiC layer 16 is formed by arranging a pair of focus rings 10 in this state in the chamber of the CVD film formation apparatus 50. By employing this method, in the new SiC layer 16 formed on each of the focus rings 10, the new SiC layer 16 formed on the non-active surface 10b can be made thicker than that formed on the active surface 10a as illustrated in FIG. 8.

The fabrication step and the cleaning step after the deposition step of the new SiC layer 16 are similar to those of the film structure reproduction method of the first embodiment described above. The fabrication step and the cleaning step are performed for each focus ring 10.

Figure 9:
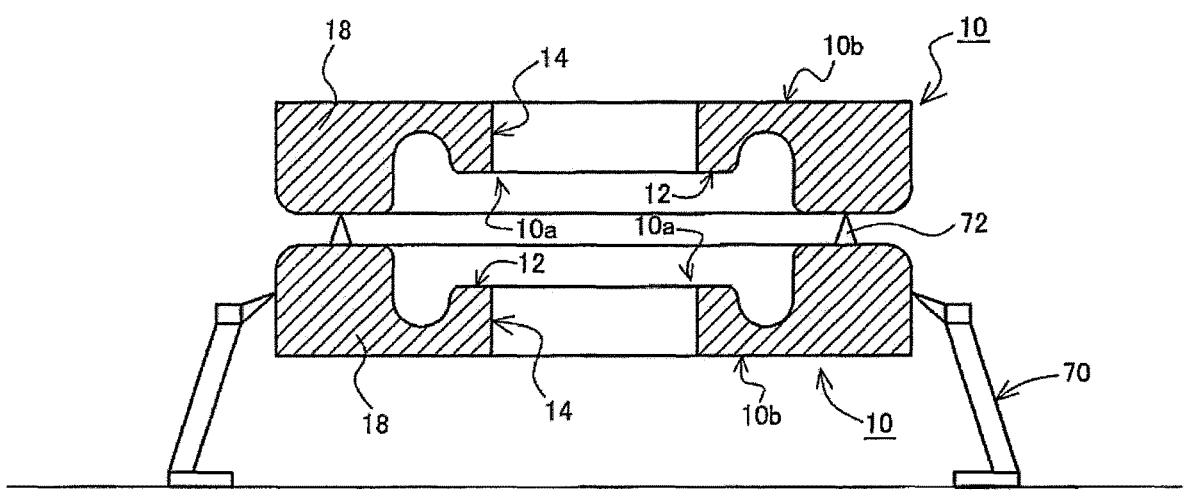
FIG. 9 is a diagram illustrating a specific example for horizontally arranging the focus rings when the film structure reproduction method according to the second embodiment is carried out.

Here, the focus rings 10 may be placed, for example, in the following way. First, in a case where two focus rings 10 are horizontally arranged, as illustrated in FIG. 9, the focus rings 10 arranged in a stacked manner may be placed in a floating state floating from the mounting table using an outer surface support jig 70 capable of partially supporting the outer surface of the lower focus ring 10. In addition, in a case where the lower focus ring 10 and the upper focus ring 10 are arranged slightly apart from each other, a spacing support jig 72 may be arranged between the active surfaces 10a of the two focus rings 10.

This is because, by employing such a placement form, the source gas that has been converted into a plasma state also flows to the non-active surface 10b of the lower focus ring 10 to form a new SiC layer 16.

Figure 10:
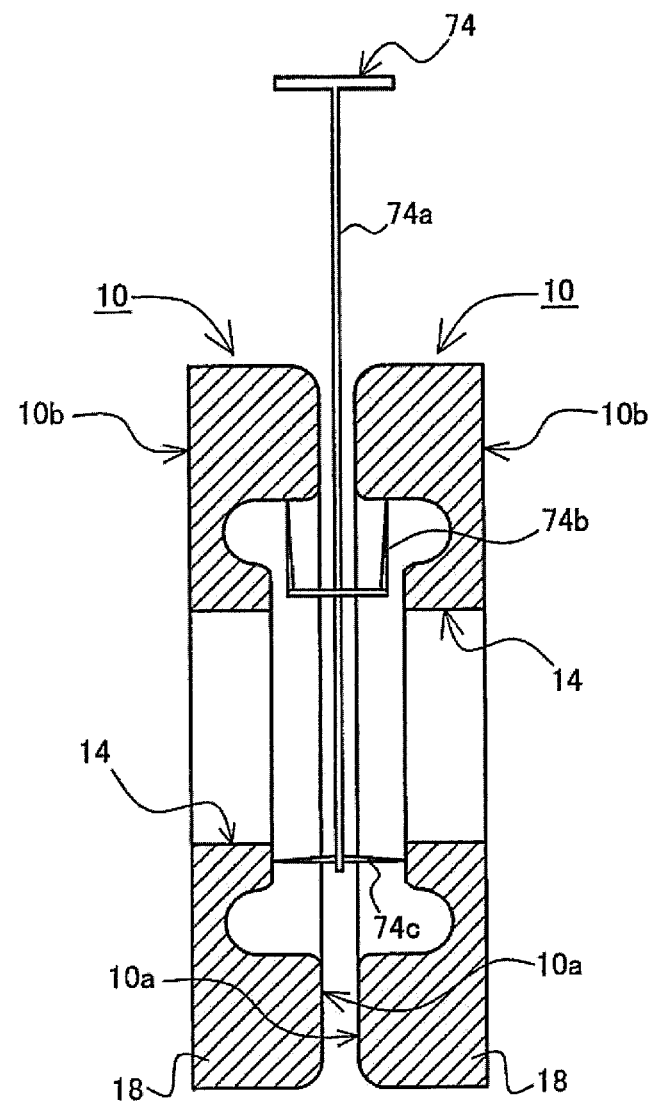
FIG. 10 is a diagram illustrating a specific example for vertically arranging the focus rings when the film structure reproduction method according to the second embodiment is carried out.

In a case where the focus rings 10 are vertically arranged, a suspending jig 74 having a suspending portion 74a arranged between the two focus rings 10, an inner surface support portion 74b protruding to the focus ring 10 arrangement side from the suspending portion 74a, an active surface support portion 74c, and the like may be used to support the focus rings 10 as illustrated in FIG. 10. Even in such a placement method, it is possible to deposit the new SiC layer 16 in the non-active surface 10b sides of the two focus rings 10. Note that, when such a placement form is employed, the new SiC layer 16 can be formed by heating the focus rings 10 using any method, employing a hot wall type CVD film formation apparatus, or employing a PVD film formation method.

In the aforementioned embodiments, reproduction of the focus ring 10 has been described by exemplifying the focus ring 10 which is a jig used in semiconductor manufacturing as an example of the film structure. However, the film structure reproduction method according to the present invention can be applied to various film structures that may be damaged on the surface. For example, although the SiC member has been described by way of example on the basis of utility in terms of cost in the aforementioned embodiments, the present invention is also applicable to a film structure such as silicon (Si).

REFERENCE SIGNS LIST 10 focus ring,
10a active surface,
10b non-active surface,
12 step,
14 through-hole,
16 new SiC layer,
18 old SiC layer,
50 CVD film formation apparatus,
52 chamber,
52a, 52b valve,
54 shower head,
56 mounting table,
56a heater,
58 vacuum pump,
60 source gas container,
62 high frequency power source,
64 matching circuit,
70 outer surface support jig,
72 spacing support jig,
74 suspending jig,
74a suspending portion,
74b inner surface support portion,
74c active surface support portion.

What is claimed is:
1. A film structure reproduction method comprising:
a new film layer deposition step of depositing a new film layer on a surface opposite to a damaged surface having a thickness equal to or larger than a depth of a deepest damage by setting the surface opposite to the damaged surface as a main body formation surface; and
an active surface fabrication step of fabricating the damaged surface to have a desired shape,
wherein, in the new film layer deposition step, deposition is performed while damaged surfaces of two film structures face each other,
in the active surface fabrication step, fabrication is performed until a depth at which the damaged surface is completely removed, and
a space formed between the damaged surfaces of the two film structures facing each other is smaller than the thickness of the new film layer.

2. The film structure reproduction method according to claim 1, wherein the film structure is a SiC member.

* * * * *